United States Patent
Lim et al.

(10) Patent No.: US 8,097,088 B1
(45) Date of Patent: Jan. 17, 2012

(54) METHODS FOR PROCESSING SUBSTRATES IN A DUAL CHAMBER PROCESSING SYSTEM HAVING SHARED RESOURCES

(75) Inventors: Eu Jin Lim, Sunnyvale, CA (US); Adauto Diaz, Jr., Saratoga, CA (US); Benjamin Schwarz, San Jose, CA (US); James P. Cruse, Santa Cruz, CA (US); Charles Hardy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/088,791

(22) Filed: Apr. 18, 2011

Related U.S. Application Data

(60) Provisional application No. 61/390,845, filed on Oct. 7, 2010.

(51) Int. Cl.
*B08B 5/00* (2006.01)

(52) U.S. Cl. ............... 134/1.1; 134/1; 134/1.2; 134/1.3; 134/18; 134/21; 134/22.1; 134/22.18; 134/25.4; 134/26; 134/30; 134/36; 134/37; 134/42; 134/902; 216/64; 216/67; 438/710; 438/905

(58) Field of Classification Search ............... 134/1, 1.1, 134/1.2, 1.3, 18, 21, 22.1, 22.18, 25.4, 26, 134/30, 36, 37, 42, 902; 216/64, 67
See application file for complete search history.

(56) References Cited

U.S. PATENT DOCUMENTS 7,813,895 B2 * 10/2010 Tallavarjula et al. ......... 702/182
* cited by examiner

*Primary Examiner* — Bibi Carrillo
(74) *Attorney, Agent, or Firm* — Alan Taboada; Moser Taboada

(57) ABSTRACT

Methods for processing substrates in dual chamber processing systems comprising first and second process chambers that share resources may include performing a first internal chamber clean in each of the first process chamber and the second process chamber; and subsequently processing a substrate in one of the first process chamber or the second process chamber by: providing a substrate to one of the first process chamber or the second process chamber; providing a process gas to the first process chamber and the second process chamber; forming a plasma in only the one of the first process chamber or the second process chamber having the substrate contained therein; and providing an inert gas to the first process chamber and the second process chamber via one or more channels formed in a surface of respective substrate supports disposed in the first process chamber and the second process chamber while processing the substrate.

20 Claims, 2 Drawing Sheets

METHODS FOR PROCESSING SUBSTRATES IN A DUAL CHAMBER PROCESSING SYSTEM HAVING SHARED RESOURCES

CROSS-REFERENCE TO RELATED APPLICATIONS

This application claims benefit of U.S. provisional patent application Ser. No. 61/390,845, filed Oct. 7, 2010, which is herein incorporated by reference.

FIELD

Embodiments of the present invention generally relate to semiconductor processing.

BACKGROUND

Dual chamber processing systems are sometimes used to increase the efficiency of substrate processing by allowing two individual substrates to be processed simultaneously (i.e., one substrate in each process chamber of the dual chamber processing system). In some configurations, dual chamber processing systems may use shared resources, such as a gas distribution system to provide gases to the individual process chambers of the dual chamber processing system. However, when processing only one substrate in the dual chamber processing system, with one process chamber having no substrate to be processed, potential problems may arise in the empty process chamber relating to chamber conditioning, particle formation, and/or substrate defects.

Accordingly, the inventors have provided improved methods for processing substrates in a dual chamber processing system.

SUMMARY

In some embodiments, a method for processing substrates in dual chamber processing systems comprising first and second process chambers and a second process chamber that share resources may include performing a first internal chamber clean in each of the first process chamber and the second process chamber; and subsequently processing a substrate in one of the first process chamber or the second process chamber by: providing a substrate to one of the first process chamber or the second process chamber; providing a process gas to the first process chamber and the second process chamber; forming a plasma in only the one of the first process chamber or the second process chamber having the substrate contained therein; and providing an inert gas to the first process chamber and the second process chamber via one or more channels formed in a surface of respective substrate supports disposed in the first process chamber and the second process chamber while processing the substrate.

In some embodiments, a method for processing substrates in dual chamber processing systems comprising first and second process chambers and a second process chamber that share resources may include: performing a first internal chamber clean in each of the first process chamber and the second process chamber; subsequently processing a substrate in one of the first process chamber or the second process chamber; and performing a second in situ chamber clean in each of the first process chamber and second process chamber, wherein processing the substrate in one or the first process chamber comprises: providing a substrate to one of the first process chamber or the second process chamber; providing a process gas to the first process chamber and the second process chamber; forming a plasma in only the one of the first process chamber or the second process chamber having the substrate contained therein; providing an inert gas to the first process chamber and the second process chamber via one or more channels formed in a surface of respective substrate supports disposed in the first process chamber and the second process chamber while processing the substrate; and maintaining the first process chamber and the second process chamber at a substantially similar temperature while processing the substrate.

In some embodiments, the inventive methods of the present invention may be embodied in a computer readable medium. The computer readable medium includes instructions stored thereon that, when executed by the controller, causes a dual chamber processing system comprising a first process chamber and a second process chamber that share resources to perform a method for processing substrates, wherein the method may include any of the methods described herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
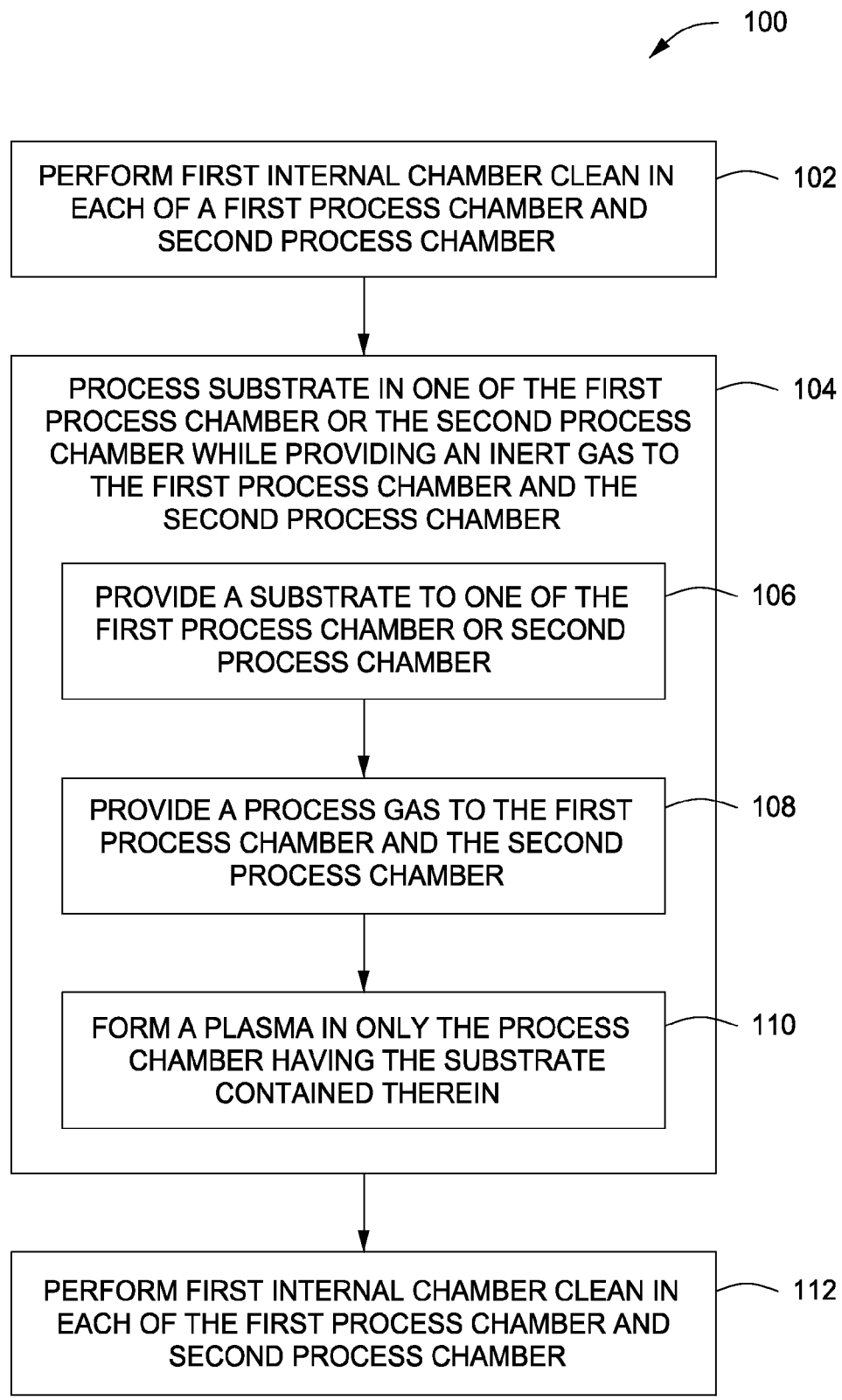
FIG. 1 is a method for processing substrates in a dual chamber processing system having shared resources in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for processing substrates in a dual chamber processing system having shared resources are provided herein. The inventors have discovered that in dual chamber processing systems having shared gas distribution and/or exhaust systems, process gases used to process the substrate should be supplied to both chambers in order to ensure stable chamber conditions in both the substrate containing chamber and the non-substrate containing chamber. For example, the inventors have discovered that the process gases should be supplied to both process chambers to provide for equal flow conductance in gas supply lines that provide the process gases to each process chamber. However, the inventors have discovered that, in the non-substrate containing process chamber, the process gases may condense on one or more interior surfaces or components (e.g., interior walls, substrate support, gas lines, or the like), which can lead to contamination, corrosion, particle formation, or the like, which may further result in process drift, lower mean time between cleans (MTBC), and/or device defects or failures.

Embodiments of the inventive methods may advantageously reduce or eliminate condensation of process gases on internal chamber surfaces and components of the empty process chamber, which may facilitate reducing or eliminating contamination, corrosion, and/or particle formation within the empty process chamber. Embodiments of the present invention may thus advantageously increase the efficiency of the processing system and reduce the cost to operate.

FIG. 1 depicts a method 100 for processing substrates in a dual chamber processing system having shared resources in accordance with some embodiments of the present invention. The method 100 may be performed in any dual chamber processing system having shared gas distribution resources, for example, the dual chamber processing system 200 having a first process chamber 201 and a second process chamber 203, as described in more detail below.

The method 100 generally begins at 102 where a first internal chamber clean is performed on a first process chamber and a second process chamber of a dual chamber processing (e.g., first and second process chambers 201, 203 of the dual chamber processing system 200 described below). In some embodiments, the first internal chamber clean may be performed immediately prior to processing a single substrate in the dual chamber processing system. As used herein, immediately prior means that no substrate processing occurs in the dual chamber processing system between the internal chamber clean and the processing of the single substrate, as discussed below. The term immediately prior is not intended to imply processing the single substrate prior to the lapsing of any specific duration of time after the internal chamber clean.

The first internal chamber clean may facilitate the removal of by-products, residual process gases, and/or residues remaining from previously performed processes. Alternatively or in combination, the first internal chamber clean may facilitate conditioning or preparing the process chamber being cleaned for performing subsequent processes. For example, in some embodiments, the dual chamber processing system may be used to process a lot, or batch, of substrates having an odd number and, upon completion of all but the last substrate, the first internal chamber clean may be performed. Performing the first internal chamber clean on both the first process chamber and the second process chamber facilitates keeping the condition of both process chambers more uniform, and in some embodiments, as uniform as possible.

The first internal chamber clean may be any cleaning process suitable to clean the type of process chambers used. For example, in some embodiments, a cleaning gas may be supplied to the process chambers to remove residues and other particles from the interior surfaces of the process chambers. The cleaning gas may be any gas suitable to clean the process chambers, for example such as a fluorine-containing gas (such as carbon tetrafluoride ($CF_4$)), oxygen ($O_2$), argon (Ar), chlorine ($Cl_2$), helium (He), methane ($CH_4$), boron trichloride ($BCl_3$), or the like.

In some embodiments, a plasma may be formed from the cleaning gas to facilitate cleaning the process chambers. In such embodiments, a plasma power source, for example such as an RF power source, may be provided to couple a plasma power to the cleaning gas to ignite and form the plasma. In addition, other process parameters may be utilized to form and maintain the plasma during the internal chamber clean. For example, in some embodiments, the process chambers may be maintained at a desired pressure or temperature to facilitate forming and maintaining the plasma. In some embodiments, the amount of power provided, or the pressure or temperature maintained within the process chambers, may be dependent on the particular application (e.g., the type of process chamber and/or any processes performed within the process chamber prior to, or subsequent to, the first internal chamber clean).

After completion of the first internal chamber clean, a substrate is processed in the first process chamber, with the second chamber having no substrate, as shown at 104. Alternatively, the substrate may be processed in the second process chamber, with no substrate in the first process chamber. The substrate may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 226 may be a semiconductor wafer (e.g., a 200 mm, 300 mm, or the like silicon wafer). The process may be any suitable process, for example such as an etch process, a deposition process, or the like.

To process the substrate, the substrate is provided to one of the first or the second process chamber, at 106. The process chamber selected (i.e., the first process chamber or second process chamber) to process the substrate may be randomly selected, or in some embodiments, predetermined based on previous use (e.g. alternating between a single substrate processed, a predetermined amount of substrates processed, or the like). For example, in some embodiments, a first lot of substrates having an odd number may be processed in the dual substrate processing system and, upon reaching the last substrate, the last substrate may be processed in the first chamber. In some embodiments, a second lot of substrates having an odd number may be subsequently processed in the dual substrate processing system and, upon reaching the last substrate, the last substrate may be processed in the second chamber. In any sequence of processing lots of substrates in the dual chamber processing system, odd substrates (i.e., the last substrate of lots having an odd number) of different lots may be processed in the same process chamber as a previous last substrate, in alternating process chambers for each subsequent odd substrate, in a randomly selected process chamber for each odd substrate, or in one process chamber for a preselected number of substrates followed by switching to the other process chamber for a preselected number of substrates. Other process chamber selection criteria may also be used.

Next, at 108, a process gas is provided to the first process chamber and the second process chamber. Providing the process gas to both the substrate containing process chamber and non-substrate containing chamber facilitates maintaining stable and uniform chamber conditions between the first process chamber and the second process chamber. The process gas may comprise any gas suitable for the particular process being performed. For example, in embodiments where the process being performed is an etch process, the process gas may comprise an etchant, for example such as one or more halogen-containing gases or other suitable gases for etching particular materials. Non-limiting examples of halogen-containing etchant gases may include hydrogen bromide (HBr), chlorine-containing gases such as silicon tetrachloride ($SiCl_4$), boron trichloride ($BCl_3$), or the like. In some embodiments, the etchant may comprise a hydrocarbon gas, such as methane ($CH_4$), ethylene ($C_2H_4$), or the like.

Alternatively, or in combination, the process gas may comprise an inert gas, such as argon (Ar), helium (He), krypton (Kr), neon (Ne), xenon (Xe), or the like. The process gas may be provided at any suitable flow rate to perform the desired process.

Next, at 110, a plasma may be formed from the process gas in only the process chamber having the substrate contained therein to facilitate the substrate process. In some embodiments, the plasma may be formed by coupling sufficient energy (e.g., RF power source 208, 209 of process chambers 201, 203 described below) to the process gas within the process chamber under suitable conditions to establish and maintain the plasma. In addition, other process parameters may be utilized to form and maintain the plasma. For example, in some embodiments, the process chamber may be maintained at a desired pressure or temperature to facilitate forming and maintaining the plasma. In some embodiments, the amount of power provided, or the pressure or temperature maintained within the process chambers, may be dependent on the particular application (e.g., the type of process being performed and/or the process gases used). In some embodiments, both the first process chamber and the second process chamber are maintained at a substantially similar temperature to provide uniform and stable chamber conditions between the first process chamber and the second process chamber.

The inventors have observed that when gas is provided only to one of the process chambers when processing a single substrate, the gas provided from the shared gas distribution system does not flow as it does when gas is provided to both of the process chambers of the dual chamber processing system. The inventors have discovered that providing gas to both of the process chambers facilitates equal flow conductance in the gas supply lines that provide the process gases to each process chamber, thereby leading to more uniform gas delivery. However, the inventors have further observed that in the process chamber not utilized to perform the substrate process described above, the process gases provided may condense on one or more interior surfaces or components (e.g. interior walls, substrate support, gas lines, or the like), which may lead to contamination, corrosion, and/or particle formation, which may result in process drift, lower mean time between cleans (MTBC), and/or device failures. For example, in embodiments where the process chambers comprise an electrostatic chuck having flow channels or holes to provide backside wafer cooling (e.g., the one or more gas channels 213 of substrate support 202 described below), process gases (e.g., such as the process gases described above) may condense within the flow channels or holes and corrode the channels.

Accordingly, while performing the above substrate process at 104, an inert gas may be provided to both the first process chamber and the second process chamber. For example, in some embodiments, the inert gas may be provided to both the first process chamber and the second process chamber via a plurality of channels formed in a surface of a substrate support disposed in the first process chamber and the second process chamber (e.g. the one or more gas channels 213 of substrate support 202 described below). Providing the inert gas may reduce or eliminate the amount of process gas condensation that may occur, thereby preventing the aforementioned contamination, corrosion and particle formation. The inert gas may be any inert gas, such as argon (Ar), helium (He), krypton (Kr), neon (Ne), xenon (Xe), or the like. In some embodiments, the inert gas may be provided at a flow rate based on parameters particular to the recipe of the process performed, for example, such as an inert gas pressure provided to the process chamber in which the substrate process is performed.

In some embodiments, upon completion of processing of the single substrate, after removal of the substrate from the process chamber, a second internal chamber clean may be performed in each of the first process chamber and the second process chamber, as shown at 112. The second internal chamber clean removes by-products, residual process gases and/or other residues remaining from the process performed at 104. In addition, performing the second internal chamber clean on both the first process chamber and the second process chamber facilitates maintaining a more uniform condition of both chambers. The second internal chamber clean may be any cleaning process suitable to clean the type of process chambers used. In some embodiments, the second internal chamber clean may be the same cleaning process, or in some embodiments a different cleaning process than that of the first internal chamber clean.

After the second internal chamber clean is performed at 112, the method 100 generally ends and additional substrates may be processed in either or both of the process chambers of the dual chamber processing system. As noted above, the method 100 may be repeated upon reaching the last substrate of subsequent odd lots of substrates processed in the dual chamber processing system.

Figure 2:
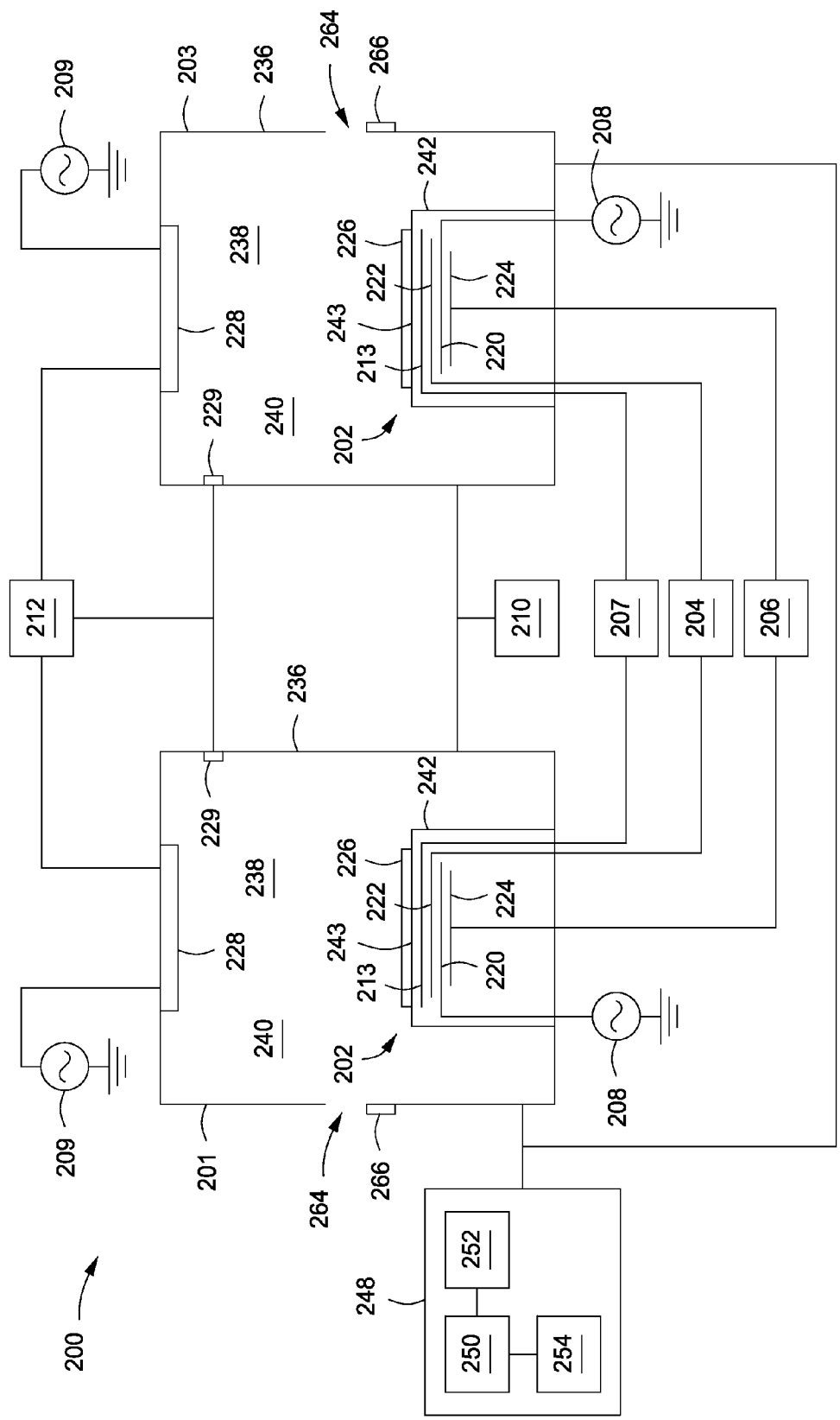
FIG. 2 depicts a dual chamber processing system suitable to perform a method for processing substrates in accordance with some embodiments of the present invention.

FIG. 2 depicts a dual chamber processing system 200 suitable to perform the method 100 described above. Generally, the dual chamber processing system 200 comprises two process chambers 201, 203 having one or more shared resources (e.g., gas supply 212, power source 204, chucking power source 206 or the like). The process chambers 201, 203 may be any type of process chamber suitable for semiconductor processing, for example, such as an etch chamber, deposition chamber, annealing chamber, or the like. In some embodiments, for example where the process chambers 201, 203 are etch chambers, the process chambers 201, 203 may include any of the Decoupled Plasma Source (DPS) line of chambers, a HART™, E-MAX®, or ENABLER® etch chamber available from Applied Materials, Inc., of Santa Clara, Calif. Other etch chambers, including those from other manufacturers, may be utilized.

In some embodiments, the process chambers 201, 203 may generally comprise a chamber body 236 defining an inner volume 240 that may include a processing volume 238. The processing volume 238 may be defined, for example, between a substrate support 202 disposed within the process chamber 201, 203 for supporting a substrate 226 thereupon during processing and one or more gas inlets, such as a showerhead 228 and/or nozzles 229 provided at desired locations.

In some embodiments, the substrate support 202 may include a mechanism that retains or supports the substrate 226 on the surface 242 of the substrate support pedestal 202, such as an electrostatic chuck, a vacuum chuck, a substrate retaining clamp, or the like. For example, in some embodiments, the substrate support pedestal 202 may include a chucking electrode 224 disposed within an support pedestal 202. The chucking electrode 224 may be coupled to one or more chucking power sources (one shared chucking power source 206 shown) through one or more respective matching networks (not shown). The one or more chucking power sources 206 may be capable of producing up to 12,000 W at a frequency of about 2 MHz, or about 13.56 MHz, or about 60 Mhz. In some embodiments, the one or more chucking power source 206 may provide either continuous or pulsed power. In some embodiments, the chucking power source may be a DC or pulsed DC source.

In some embodiments, the substrate support 202 may include one or more mechanisms for controlling the temperature of the substrate support surface 242 and the substrate 226 disposed thereon. For example, one or more channels (not shown) may be provided to define one or more flow paths beneath the substrate support surface 242 to flow a heat transfer fluid provided by a shared heat transfer fluid source (not shown). The one or more channels may be configured in any manner suitable to provide adequate control over temperature profile across the substrate support surface 242 and the substrate 226 disposed thereon during processing. In some embodiments, the one or more channels may be disposed within a cooling plate (not shown).

The heat transfer fluid may comprise any fluid suitable to provide adequate transfer of heat to or from the substrate 226. For example, the heat transfer fluid may be a gas, such as helium (He), oxygen ($O_2$), or the like, or a liquid, such as water, antifreeze, or an alcohol, for example, glycerol, ethylene glycerol, propylene, methanol, or the like.

In some embodiments, one or more heaters (one per chamber shown) 222 may be disposed proximate the substrate support 202 to further facilitate control over the temperature of the substrate support surface 242. The one or more heaters 222 may be any type of heater suitable to provide control over the substrate temperature. For example, the one or more heaters 222 may be one or more resistive heaters. In such embodiments, the one or more heaters 222 may be coupled to a power source 204 configured to provide the one or more heaters 222 with power to facilitate heating the one or more heaters 222. In some embodiments the heaters may be disposed above or proximate to the substrate support surface 242. Alternatively, or in combination, in some embodiments, the heaters may be embedded within the substrate support 202. The number and arrangement of the one or more heaters may be varied to provide additional control over the temperature of the substrate 226. For example, in embodiments where more than one heater is utilized, the heaters may be arranged in a plurality of zones to facilitate control over the temperature across the substrate 226, thus providing increased temperature control.

In some embodiments, substrate support surface 242 may comprise one or more gas channels 213 to provide a gas flow from a gas supply 207 to an interface 243 between the substrate support surface 242 and the substrate 226 to contact the back side of the substrate 226 disposed atop of the substrate support 202. Control over the gas pressure provided to the interface 243 facilitates control over heating and cooling of the substrate.

The substrate 226 may enter the process chamber 201, 203 via an opening 264 in a wall of the process chamber 201, 203. The opening 264 may be selectively sealed via a slit valve 266, or other mechanism for selectively providing access to the interior of the chamber through the opening 264. The substrate support 202 may be coupled to a lift mechanism (not shown) that may control the position of the substrate support pedestal 202 between a lower position suitable for transferring substrates into and out of the chamber via the opening 264 and a selectable upper position suitable for processing. The process position may be selected to maximize process uniformity for a particular process. When in at least one of the elevated processing positions, the substrate support pedestal 202 may be disposed above the opening 264 to provide a symmetrical processing region.

The one or more gas inlets (i.e. the showerhead 228 and/or nozzles 229) may be coupled to independent or a shared gas supply 212 for providing one or more process gases into the processing volume 238 of the process chambers 201, 203. Although a showerhead 228 and nozzles 229 are shown in FIG. 2, additional or alternative gas inlets may be provided such as nozzles or inlets disposed in the ceiling or on the sidewalls of the process chambers 201, 203 or at other locations suitable for providing gases as desired to the process chambers 201, 203, such as the base of the process chamber, the periphery of the substrate support 202, or the like.

In some embodiments, the process chambers 201, 203 may utilize capacitively coupled RF power for plasma processing, although the process chambers 201, 203 may also or alternatively use inductive coupling of RF power for plasma processing. For example, the substrate support 202 may have an electrode 220 disposed therein, or a conductive portion of the substrate support 202 may be used as the electrode. The electrode 220 may be coupled to one or more plasma power sources (one RF power source 208 per process chamber shown) through one or more respective matching networks (not shown). Alternatively, or in combination, in some embodiments, one or more plasma power sources (one RF power source 209 per process chamber shown) may be coupled to the showerhead 228. In some embodiments, for example where the substrate support 202 is fabricated from a conductive material (e.g., a metal such as aluminum) the entire substrate support 202 may function as an electrode, thereby eliminating the need for a separate electrode 220. The one or more plasma power sources 208 may be capable of producing up to about 5,000 W at a frequency of about 2 MHz and or about 13.56 MHz or high frequency, such as 27 MHz and/or 60 MHz.

A shared vacuum pump 210 may be coupled to the process chambers 201, 203 via a pumping plenum and pumping port for pumping out exhaust gases from the process chambers 201, 203. The vacuum pump 210 may be fluidly coupled to an exhaust outlet for routing the exhaust as required to appropriate exhaust handling equipment. A valve (such as a gate valve or the like) may be disposed in the pumping plenum to facilitate control of the flow rate of the exhaust gases in combination with the operation of the vacuum pump 210.

To facilitate control of the process chambers 201, 203, a controller 248 may be one of any form of general-purpose computer processor that can be used in an industrial setting for controlling various chambers and sub-processors. The memory 254, or computer-readable medium of the CPU 250 may be one or more of readily available memory such as random access memory (RAM), read only memory (ROM), floppy disk, hard disk, or any other form of digital storage, local or remote. The support circuits 252 are coupled to the CPU 250 for supporting the processor in a conventional manner. These circuits include cache, power supplies, clock circuits, input/output circuitry and subsystems, and the like.

The inventive methods disclosed herein may generally be stored in the memory 254 as a software routine that, when executed by the CPU 250, causes the process chambers 201, 203 to perform processes of the present invention. The software routine may also be stored and/or executed by a second CPU (not shown) that is remotely located from the hardware being controlled by the CPU 250. Some or all of the method of the present invention may also be performed in hardware. As such, the invention may be implemented in software and executed using a computer system, in hardware as, e.g., an application specific integrated circuit or other type of hardware implementation, or as a combination of software and hardware. The software routine, when executed by the CPU 250, transforms the general purpose computer into a specific purpose computer (controller) 248 that controls the chamber operation such that the methods disclosed herein are performed.

Thus, methods for processing substrates in a dual chamber processing system having shared resources have been provided herein. The inventive methods may advantageously prevent the condensation of process gases on internal chamber surfaces and components, thus reducing or eliminating contamination, corrosion and particle formation within the process chambers, thereby increasing the efficiency of the processing system and reducing the cost to operate.

While the foregoing is directed to embodiments of the present invention, other and further embodiments of the invention may be devised without departing from the basic scope thereof.

The invention claimed is:

1. A method for processing substrates in a dual chamber processing system comprising a first process chamber and a second process chamber that share resources, the method comprising:
  performing a first internal chamber clean in each of the first process chamber and the second process chamber; and
  subsequently processing a substrate in one of the first process chamber or the second process chamber by:
    providing a substrate to one of the first process chamber or the second process chamber;
    providing a process gas to the first process chamber and the second process chamber;
    forming a plasma in only the one of the first process chamber or the second process chamber having the substrate contained therein; and
    providing an inert gas to the first process chamber and the second process chamber via one or more channels formed in a surface of respective substrate supports disposed in the first process chamber and the second process chamber while processing the substrate.

2. The method of claim 1, further comprising:
  performing a second internal chamber clean in each of the first process chamber and second process chamber.

3. The method of claim 1, wherein the inert gas comprises one of argon (Ar), helium (He), krypton (Kr), neon (Ne), xenon (Xe).

4. The method of claim 1, further comprising:
  maintaining the first process chamber and the second process chamber at a substantially similar temperature while processing the substrate.

5. The method of claim 1, wherein the process gas comprises at least one of hydrogen bromide (HBr), silicon tetrachloride ($SiCl_4$), boron trichloride ($BCl_3$), methane ($CH_4$) or ethylene ($C_2H_4$).

6. The method of claim 1, wherein the process gas is provided to the first and second chamber at a flow rate to maintain stable and uniform chamber conditions between the first process chamber and the second process chamber.

7. The method of claim 1, wherein providing the substrate to the first or second chamber comprises:
  randomly selecting either the first process chamber or second process chamber; and
  providing the substrate to the randomly selected first process chamber or second process chamber.

8. The method of claim 1, wherein providing the substrate to the first or second chamber comprises:
  selecting either the first process chamber or second process chamber based on a predetermined criteria; and
  providing the substrate to the selected first process chamber or second process chamber.

9. The method of claim 8, wherein the predetermined criteria comprises an amount of substrates previously processed in the first process chamber and second process chamber.

10. The method of claim 1, wherein the first internal chamber clean comprises:
  providing a cleaning gas comprising at least one of carbon tetrafluoride ($CF_4$), oxygen ($O_2$), argon (Ar), chlorine ($Cl_2$), helium (He), methane ($CH_4$), or boron trichloride ($BCl_3$) to the process chamber; and
  igniting the cleaning gas to form a plasma to clean the first process chamber and the second process chamber.

11. A computer readable medium having instructions stored thereon that, when executed by the controller, causes a dual chamber processing system comprising a first process chamber and a second process chamber that share resources to perform a method for processing substrates, the method comprising:
  performing a first internal chamber clean in each of the first process chamber and the second process chamber; and
  subsequently processing a substrate in one of the first process chamber or the second process chamber by:
    providing a substrate to one of the first process chamber or the second process chamber;
    providing a process gas to the first process chamber and the second process chamber;
    forming a plasma in only the one of the first process chamber or the second process chamber having the substrate contained therein; and
    providing an inert gas to the first process chamber and the second process chamber via one or more channels formed in a surface of respective substrate supports disposed in the first process chamber and the second process chamber while processing the substrate.

12. The computer readable medium of claim 11, further comprising:
  performing a second internal chamber clean in each of the first process chamber and second process chamber after processing the substrate.

13. The computer readable medium of claim 11, further comprising:
  maintaining the first process chamber and the second process chamber at a substantially similar temperature while processing substrate.

14. The computer readable medium of claim 11, wherein the process gas comprises one of hydrogen bromide (HBr), silicon tetrachloride ($SiCl_4$), boron trichloride ($BCl_3$), methane ($CH_4$) or ethylene ($C_2H_4$).

15. The computer readable medium of claim 11, wherein the process gas is provided to the first and second chamber at a flow rate to maintain stable and uniform chamber conditions between the first process chamber and the second process chamber.

16. The computer readable medium of claim 11, wherein providing the substrate to the first or second chamber comprises:
  randomly selecting either the first process chamber or second process chamber; and
  providing the substrate to the randomly selected first process chamber or second process chamber.

17. The computer readable medium of claim 11, wherein providing the substrate to the first or second chamber comprises:
  selecting either the first process chamber or second process chamber based on a predetermined criteria; and
  providing the substrate to the selected first process chamber or second process chamber.

18. The computer readable medium of claim 17, wherein the predetermined criteria comprises an amount of substrates previously processed in the first process chamber and second process chamber.

19. The computer readable medium of claim 11, wherein the first internal chamber clean comprises:
  providing a cleaning gas comprising at least one of carbon tetrafluoride ($CF_4$), oxygen ($O_2$), argon (Ar), chlorine ($Cl_2$), helium (He), methane ($CH_4$), or boron trichloride ($BCl_3$) to the process chamber; and igniting the cleaning gas to form a plasma to clean the first process chamber and the second process chamber.

20. A method for processing substrates in a dual chamber processing system comprising a first process chamber and a second process chamber that share resources, the method comprising:

performing a first internal chamber clean in each of the first process chamber and the second process chamber;

subsequently processing a substrate in one of the first process chamber or the second process chamber; and performing a second internal chamber clean in each of the first process chamber and second process chamber, wherein processing the substrate in one or the first process chamber comprises:

providing a substrate to one of the first process chamber or the second process chamber;

providing a process gas to the first process chamber and the second process chamber;

forming a plasma in only the one of the first process chamber or the second process chamber having the substrate contained therein;

providing an inert gas to the first process chamber and the second process chamber via one or more channels formed in a surface of respective substrate supports disposed in the first process chamber and the second process chamber while processing the substrate; and maintaining the first process chamber and the second process chamber at a substantially similar temperature while processing the substrate.

* * * * *